US012690232B2

(12) United States Patent
Huang et al.

(10) Patent No.: US 12,690,232 B2
(45) Date of Patent: Jul. 21, 2026

(54) MANUFACTURING METHOD OF THIN FILM TRANSISTOR

(71) Applicant: AUO Corporation, Hsinchu (TW)

(72) Inventors: Ya-Qin Huang, Hsinchu (TW); Yi-Da He, Hsinchu (TW); Chih-Hung Tsai, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 391 days.

(21) Appl. No.: 18/533,141

(22) Filed: Dec. 7, 2023

(65) Prior Publication Data

US 2024/0274719 A1 Aug. 15, 2024

(30) Foreign Application Priority Data

Feb. 15, 2023 (TW) .................................. 112105442

(51) Int. Cl.
*H10D 30/67* (2025.01)
*H10D 30/01* (2025.01)
(Continued)

(52) U.S. Cl.
CPC ....... *H10D 30/6708* (2025.01); *H10D 30/031* (2025.01); *H10D 30/0314* (2025.01);
(Continued)

(58) Field of Classification Search
CPC .......... H10D 30/3708; H10D 30/6715; H10D 30/6757; H10D 30/6721; H10D 30/6731;
(Continued)

(56) References Cited

U.S. PATENT DOCUMENTS 5,750,430 A * 5/1998 Son .................... H10D 30/0225
257/E29.054
7,288,420 B1 * 10/2007 Yamazaki ............ H10K 71/135
257/E27.111
(Continued)

FOREIGN PATENT DOCUMENTS

CN 104485278 4/2015
CN 104779168 1/2018
(Continued)

OTHER PUBLICATIONS

CN-104282696-B—Machine English Translation (Year: 2026).*

*Primary Examiner* — Jose R Diaz
(74) *Attorney, Agent, or Firm* — JCIPRNET

(57) ABSTRACT

A thin film transistor includes a semiconductor layer, a gate, a source and a drain. The semiconductor layer includes a first heavily doped region, a second heavily doped region, a bridge region, a first channel region, a second channel region, a first lightly doped region and a second lightly doped region. The first lightly doped region connects the bridge region and the first channel region. The second lightly doped region connects the bridge region and the second channel region. The doping concentration of the bridge region is greater than that of the first lightly doped region and the second lightly doped region. The gate overlaps the bridge region, the first channel region, the second channel region, the first lightly doped region and the second lightly doped region. The source and the drain are electrically connected to the first heavily doped region and the second heavily doped region respectively.

7 Claims, 31 Drawing Sheets

(51) Int. Cl.
    *H10D 86/01*       (2026.01)
    *H10D 86/40*       (2025.01)
    *H10D 86/60*       (2025.01)

(52) U.S. Cl.
    CPC ..... *H10D 30/0321* (2025.01); *H10D 30/6715* (2025.01); *H10D 30/6734* (2025.01); *H10D 30/6757* (2025.01); *H10D 86/0221* (2025.01); *H10D 86/0231* (2025.01); *H10D 86/421* (2025.01); *H10D 86/60* (2025.01)

(58) Field of Classification Search
    CPC ........... H10D 30/6734; H10D 30/0316; H10D 30/6732; H10D 86/0221
    See application file for complete search history.

(56)                References Cited

U.S. PATENT DOCUMENTS

| | | | |
|---|---|---|---|
| 11,342,460 B2 | 5/2022 | Guo et al. | |
| 2003/0053791 A1* | 3/2003 | Yoshida | G02F 1/13439 |
| | | | 385/15 |
| 2015/0090980 A1* | 4/2015 | Lee | H10D 30/6731 |
| | | | 438/34 |
| 2016/0343746 A1 | 11/2016 | Xue et al. | |
| 2021/0367081 A1* | 11/2021 | Yan | H10D 30/6757 |

FOREIGN PATENT DOCUMENTS

| | | | | |
|---|---|---|---|---|
| CN | 104282696 B | * | 7/2018 | ........... H10D 62/299 |
| TW | 202009994 | | 3/2020 | |

* cited by examiner

324

A'

226

236

310

232

222

322

A

10B

330

100

ND

130

120

110

100

310

330

L1

L2

222  232  242  212  214  216  246  236  226

200

AS

330

PR

110

100

242''          214          246''

ND

LD1

330

PR

110

100

246'  216  214  212  242'

ND

MANUFACTURING METHOD OF THIN FILM TRANSISTOR

CROSS-REFERENCE TO RELATED APPLICATION

This application claims the priority benefit of Taiwan application serial no. 112105442, filed on Feb. 15, 2023. The entirety of the above-mentioned patent application is hereby incorporated by reference herein and made a part of this specification.

BACKGROUND

Technical Field

The present invention relates to a thin film transistor and a manufacturing method thereof.

Description of Related Art

With the continuous advancement of modern information technology, display panels with various specifications have found widespread applications in consumer electronic products, including but not limited to mobile phones, notebook computers, digital cameras, and personal digital assistants (PDAs). Currently, thin-film transistors are extensively employed in the display field. In an effort to enhance the drain current of thin-film transistors, it is common practice to reduce the channel length. However, this approach often leads to the susceptibility of the drain current to the kink effect, resulting in an elevation of the saturation current. Moreover, the reduction in channel length may give rise to issues related to leakage current.

SUMMARY

The present invention offers a thin film transistor and an associated manufacturing method designed to alleviate the resistance of the semiconductor layer by means of the bridging region. Simultaneously, it aims to mitigate issues arising from the horizontal electric field within the bridging region by incorporating a first lightly doped region and a second lightly doped region.

At least one embodiment of the present invention provides a method for manufacturing a thin film transistor, including the following steps. Using a mask layer as a mask, the semiconductor material layer is doped once or twice to form a first lightly doped region, a second lightly doped region, a bridging region, a first intrinsic semiconductor region and a second intrinsic semiconductor in the semiconductor material layer, wherein the doping concentration of the bridging region is greater than the doping concentrations of the first lightly doped region and the second lightly doped region. An insulation layer is formed on the first lightly doped region, the second lightly doped region, the bridging region, the first intrinsic semiconductor region and the second intrinsic semiconductor region. Forming a gate electrode material layer on the insulation layer, wherein the gate electrode material layer overlaps the first lightly doped region, the second lightly doped region and the bridging region, and the gate electrode material layer partially overlaps the first intrinsic semiconductor region and the second intrinsic semiconductor region. Using the gate electrode material layer as a mask, another doping process is performed on the first intrinsic semiconductor region and the second intrinsic semiconductor region to form a first heavily doped region and a second heavily doped region in the first intrinsic semiconductor region and the second intrinsic semiconductor region, respectively. The gate electrode material layer is etched to form a gate electrode. Using the gate electrode as a mask, the portions of the first intrinsic semiconductor region and the second intrinsic semiconductor region that have not been doped in the aforementioned another doping process are doped to form the third lightly doped region and the fourth lightly doped region in the first intrinsic semiconductor region and the second intrinsic semiconductor region, respectively, wherein the first intrinsic semiconductor region between the first lightly doped region and the third lightly doped region is the first channel region, and the second intrinsic semiconductor region between the second lightly doped region and the fourth lightly doped region is the second channel region, wherein the first lightly doped region connects the bridging region and the first channel region, and the second lightly doped region connects the bridging region and the second channel region, and the doping concentrations of the first lightly doped region and the second lightly doped region are greater than that of the first channel region and the second channel region. A source electrode and a drain electrode are formed, wherein the source electrode and the drain electrode are electrically connected to the first heavily doped region and the second heavily doped region, respectively.

At least one embodiment of the present invention provides a thin film transistor. The thin film transistor includes a semiconductor layer, a gate electrode, a source electrode and a drain electrode. The semiconductor layer includes a first heavily doped region, a second heavily doped region, a bridging region, a first channel region, a second channel region, a first lightly doped region and a second lightly doped region. The first lightly doped region connects the bridging region and the first channel region. The second lightly doped region connects the bridging region and the second channel region. The bridging region, the first channel region, the second channel region, the first lightly doped region and the second lightly doped region are located between the first heavily doped region and the second heavily doped region. The doping concentration of the bridging region is greater than that of the first lightly doped region and the second lightly doped region. The doping concentrations of the first lightly doped region and the second lightly doped region are greater than the that of the first channel region and the second channel region. The gate electrode overlaps the bridging region, the first channel region, the second channel region, the first lightly doped region and the second lightly doped region. The source electrode and the drain electrode are electrically connected to the first heavily doped region and the second heavily doped region respectively.

DESCRIPTION OF THE EMBODIMENTS

Figure 1A:
FIG. 1A is a schematic top view of a thin film transistor according to an embodiment of the present invention.
Figure 1B:
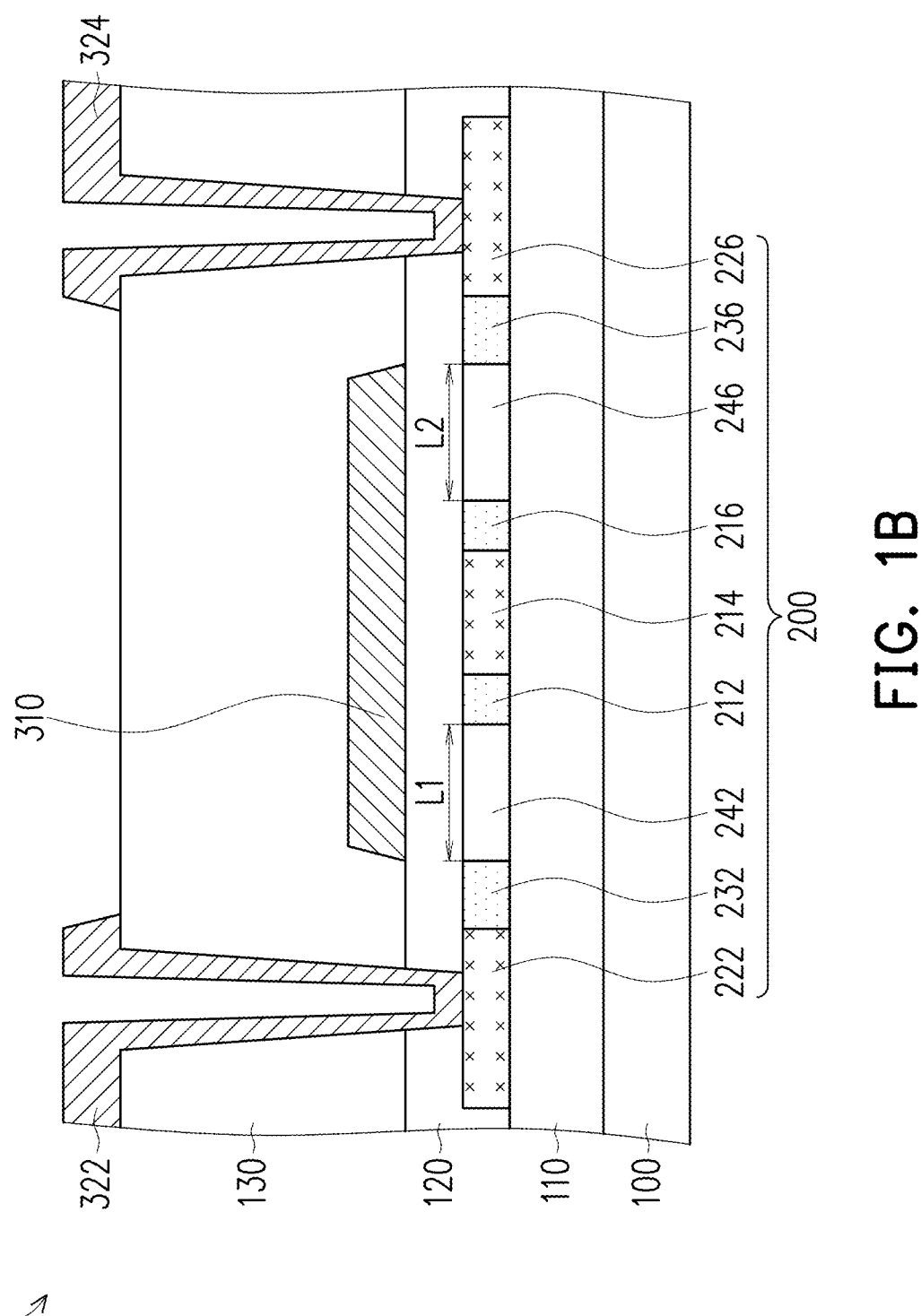
FIG. 1B is a schematic cross-sectional view taken along the line A-A' of FIG. 1A.

FIG. 1A is a schematic top view of a thin film transistor 10A according to an embodiment of the present invention. FIG. 1B is a schematic cross-sectional view taken along the line A-A' of FIG. 1A. Referring to FIGS. 1A and 1B, the thin film transistor 10A includes a semiconductor layer 200, a gate electrode 310, a source electrode 322 and a drain electrode 324. In this embodiment, the thin film transistor 10A further includes a substrate 100, a first insulation layer 110, a second insulation layer 120 and a third insulation layer 130.

The substrate 100 is, for example, a rigid substrate, and its material may be glass, quartz, organic polymer or opaque/reflective material (for example: conductive material, metal, wafer, ceramic or other suitable materials) or other suitable materials. However, the present invention is not limited thereto. In other embodiments, the substrate 100 may also be a flexible substrate or a stretchable substrate. For example, materials of the flexible substrate and the stretchable substrate may include polyimide (PI), polydimethylsiloxane (PDMS), polyethylene terephthalate (PET), polyethylene naphthalate (PEN), polyester (PES), polymethylmethacrylate (PMMA), polycarbonate (PC), polyurethane (PU) or other suitable materials.

The first insulation layer 110 is located on the substrate 100 and covers the substrate 100. The first insulation layer 110 has a single-layer structure or a multi-layer structure. In some embodiments, the material of the first insulation layer 110 includes silicon oxide, silicon nitride, silicon oxynitride, aluminum oxide, hafnium oxide, organic insulation materials, combinations of the foregoing materials, or other suitable insulation materials.

The semiconductor layer 200 is formed on the first insulation layer 110. In some embodiments, the material of the semiconductor layer 200 includes amorphous silicon, polysilicon, microcrystalline silicon, monocrystalline silicon, organic semiconductor materials, oxide semiconductor materials (such as indium zinc oxide, indium gallium zinc oxide or other suitable materials, or combinations of the above materials) or other suitable materials, or combinations of the above materials.

The semiconductor layer 200 has been doped to include a first lightly doped region 212, a bridging region 214, a second lightly doped region 216, a first heavily doped region 222, a third lightly doped region 232, a second heavily doped region 226, a fourth lightly doped region 236, a first channel region 242 and a second channel region 246. The first lightly doped region 212, the bridging region 214, the second lightly doped region 216, the first channel region 242 and the second channel region 246 are located between the first heavily doped region 222 and the second heavily doped region 226. The first lightly doped region 212 connects the bridging region 214 and the first channel region 242. The second lightly doped region 216 connects the bridging region 214 and the second channel region 246. The third lightly doped region 232 connects the first heavily doped region 222 and the first channel region 242. The fourth lightly doped region 236 connects the second heavily doped region 226 and the second channel region 246.

The doping concentrations of the bridging region 214, the first heavily doped region 222, and the second heavily doped region 226 are greater than those of the first lightly doped region 212, the second lightly doped region 216, the third lightly doped region 232, and the fourth lightly doped region 236 (e.g., exceeding by 1 to 2 orders of magnitude). The doping concentrations of the first lightly doped region 212, the second lightly doped region 216, the third lightly doped region 232 and the fourth lightly doped region 236 are greater than those of the first channel region 242 and the second channel region 246.

In some embodiments, the doping concentrations of the first lightly doped region 212 and the second lightly doped region 216 are the same or different from the doping concentrations of the third lightly doped region 232 and the fourth lightly doped region 236. In some embodiments, the doping concentration of the bridging region 214 is the same as or different from the doping concentrations of the first heavily doped region 222 and the second heavily doped region 226.

In some embodiments, the sum of the length L1 of the first channel region 242 and the length L2 of the second channel region 246 is less than 3 microns.

The second insulation layer 120 is located on the first insulation layer 110 and the semiconductor layer 200, and covering the semiconductor layer 200. The second insulation layer 120 has a single-layer structure or a multi-layer structure. In some embodiments, the material of the second insulation layer 120 includes silicon oxide, silicon nitride, silicon oxynitride, aluminum oxide, hafnium oxide, organic insulation materials, combinations of the foregoing materials, or other suitable insulation materials.

The gate electrode 310 is located on the second insulation layer 120 and overlaps the first lightly doped region 212, the bridging region 214, the second lightly doped region 216, the first channel region 242 and the second channel region 246 in the normal direction ND of the top surface of the substrate 100. In this embodiment, the gate electrode 310 does not overlap the first heavily doped region 222, the second heavily doped region 226, the third lightly doped region 232 and the fourth lightly doped region 236 in the normal direction ND of the top surface of the substrate 100.

In some embodiments, the gate electrode 310 has a single-layer structure or a multi-layer structure, and the material of the gate electrode 310 includes gold, silver, copper, aluminum, molybdenum, titanium, tantalum, other metals or alloys of the foregoing metals.

The third insulation layer 130 is located on the second insulation layer 120 and the gate electrode 310, and covering the gate electrode 310. The third insulation layer 130 has a single-layer structure or a multi-layer structure. In some embodiments, the material of the third insulation layer 130 includes silicon oxide, silicon nitride, silicon oxynitride, aluminum oxide, hafnium oxide, organic insulation materials, combinations of the foregoing materials, or other suitable insulation materials.

The source electrode 322 and the drain electrode 324 are located on the third insulation layer 130 and are electrically connected to the first heavily doped region 222 and the second heavily doped region 226, respectively. For example, the source electrode 322 and the drain electrode 324 are respectively electrically connected to the first heavily doped region 222 and the second heavily doped region 226 through conductive vias passing through the third insulation layer 130 and the second insulation layer 120.

In some embodiments, the source electrode 322 and the drain electrode 324 have a single-layer structure or a multi-layer structure, and the materials of the source electrode 322 and the drain electrode 324 include gold, silver, copper, aluminum, molybdenum, titanium, tantalum, other metals or alloys of the foregoing metals.

In this embodiment, the thin film transistor 10A is a top gate thin film transistor, but the invention is not limited thereto. In other embodiments, the thin film transistor 10A is a bottom gate thin film transistor or a double gate thin film transistor.

Based on the above, arranging the bridging region 214 within the semiconductor layer 200 can reduce the resistance of the semiconductor layer, resulting in an increased drain current for the thin film transistor 10A. Additionally, the strategic placement of the first lightly doped region 212, the second lightly doped region 216, the third lightly doped region 232, and the fourth lightly doped region 236 helps suppress the generation of the horizontal electric field. This suppression, in turn, enhances the kink effect on the drain current and addresses issues related to leakage current.

Figure 2A:
FIG. 2A is a schematic top view of a thin film transistor according to an embodiment of the present invention.
Figure 2B:
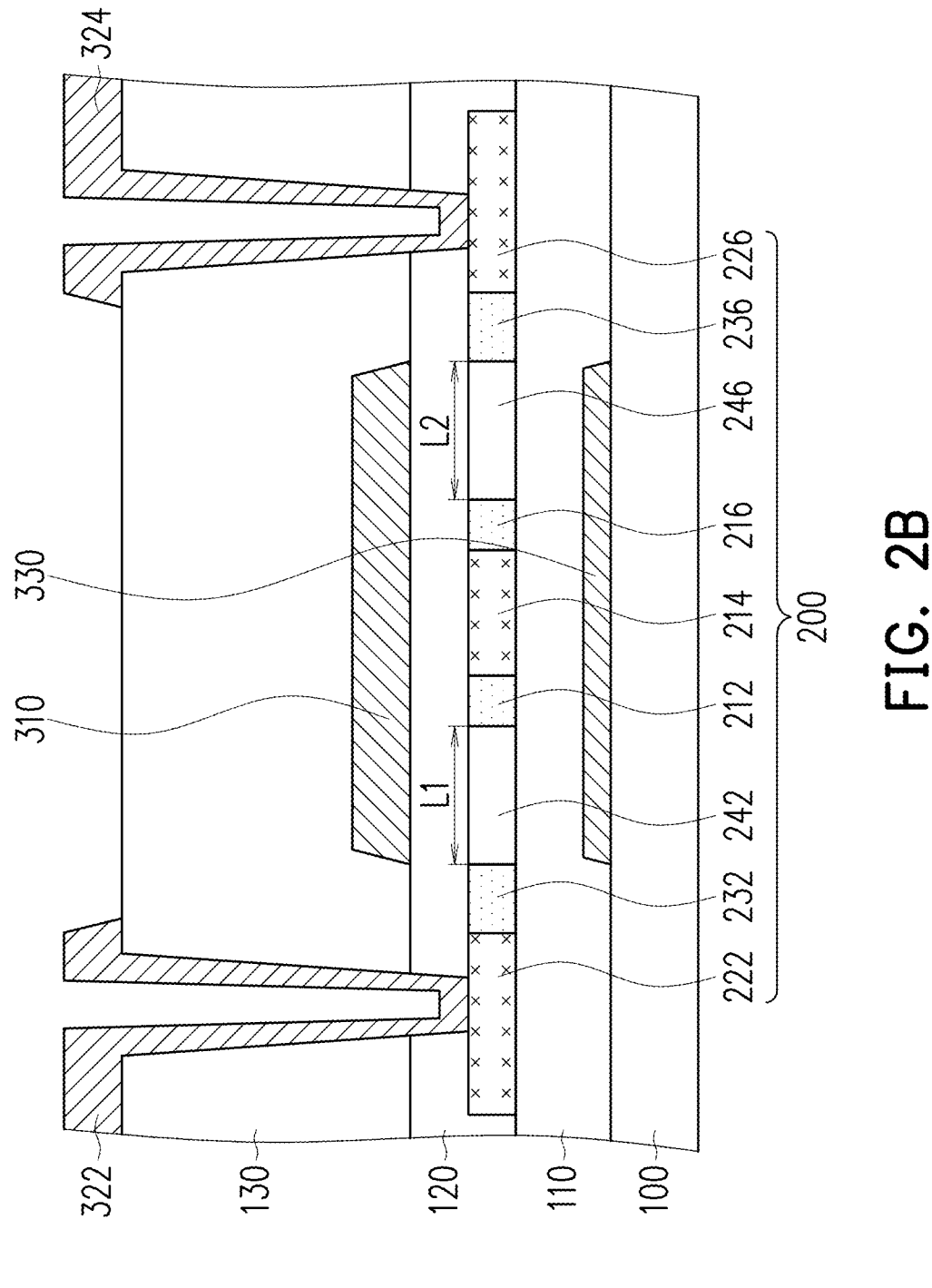
FIG. 2B is a schematic cross-sectional view taken along the line A-A' of FIG. 2A.

FIG. 2A is a schematic top view of a thin film transistor 10B according to an embodiment of the present invention. FIG. 2B is a schematic cross-sectional view taken along the line A-A' of FIG. 2A. It should be noted herein that, in embodiments provided in FIG. 2A and FIG. 2B, element numerals and partial content of the embodiments provided in FIG. 1A to FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the thin film transistor 10B in FIG. 2B and the thin film transistor 10A in FIG. 1B is that the thin film transistor 10B includes two gate electrodes.

Referring to FIGS. 2A and 2B, the thin film transistor 10B includes a semiconductor layer 200, a gate electrode 310, a gate electrode 330, a source electrode 322 and a drain electrode 324. In this embodiment, the thin film transistor 10B further includes a substrate 100, a first insulation layer 110, a second insulation layer 120 and a third insulation layer 130.

The gate electrode 310 is a top gate electrode, and the gate electrode 330 is a bottom gate electrode. The gate electrode 330 is located between the substrate 100 and the first insulation layer 110, and the semiconductor layer 200 is located between the gate electrode 310 and the gate electrode 330. In this embodiment, the bridging region 214, the first channel region 242, the second channel region 246, the first lightly doped region 212 and the second lightly doped region 216 of the semiconductor layer 200 are located between the gate electrode 310 and the gate electrode 330. In this embodiment, the gate electrode 310 and the gate electrode 330 have the same length, but the invention is not limited thereto. In other embodiments, the gate electrode 310 and the gate electrode 330 include different lengths. For example, in some embodiments, the length of the gate electrode 330 is greater than the length of the gate electrode 310, so that the gate electrode 330 partially overlaps the third lightly doped region 232 and/or the fourth lightly doped region 236 in the normal direction ND of the top surface of the substrate 100.

In some embodiments, the gate electrode 330 has a single-layer structure or a multi-layer structure, and the material of the gate electrode 330 includes gold, silver, copper, aluminum, molybdenum, titanium, tantalum, other metals or alloys of the foregoing metals.

Figure 3A:
FIG. 3A is a schematic top view of a thin film transistor according to an embodiment of the present invention.
Figure 3B:
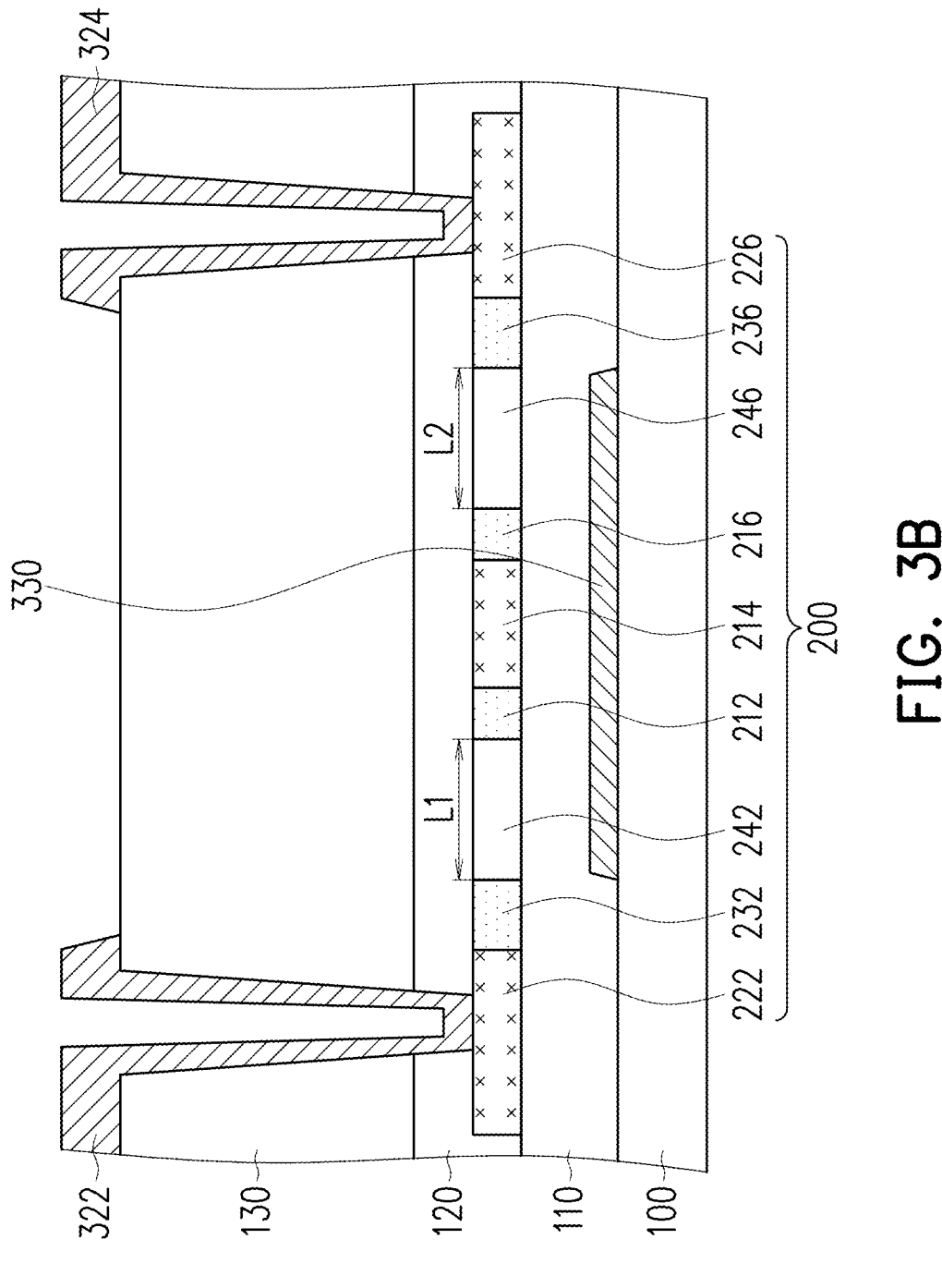
FIG. 3B is a schematic cross-sectional view taken along the line A-A' of FIG. 3A.

FIG. 3A is a schematic top view of a thin film transistor 10C according to an embodiment of the present invention. FIG. 3B is a schematic cross-sectional view taken along the line A-A' of FIG. 3A. It should be noted herein that, in embodiments provided in FIG. 3A and FIG. 3B, element numerals and partial content of the embodiments provided in FIG. 2A to FIG. 2B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the thin film transistor 10C in FIG. 3B and the thin film transistor 10A in FIG. 1B is that the thin film transistor 10C is a bottom gate thin film transistor.

Referring to FIGS. 3A and 3B, the thin film transistor 10C includes a semiconductor layer 200, a gate electrode 330, a source electrode 322 and a drain electrode 324. In this embodiment, the thin film transistor 10C further includes a substrate 100, a first insulation layer 110, a second insulation layer 120 and a third insulation layer 130.

The gate electrode 330 is a bottom gate electrode and is located between the substrate 100 and the first insulation layer 110. The gate electrode 330 overlaps the first lightly doped region 212, the bridging region 214, the second lightly doped region 216, the first channel region 242 and the second channel region 246 in the normal direction ND of the top surface of the substrate 100. In this embodiment, the gate electrode 330 does not overlap the first heavily doped region 222, the second heavily doped region 226, the third lightly doped region 232 and the fourth lightly doped region 236 in the normal direction ND of the top surface of the substrate 100, but the present invention is not limited thereto. In other embodiments, the gate electrode 330 partially overlaps the third lightly doped region 232 and/or the fourth lightly doped region 236 in the normal direction ND of the top surface of the substrate 100.

Figure 4A:
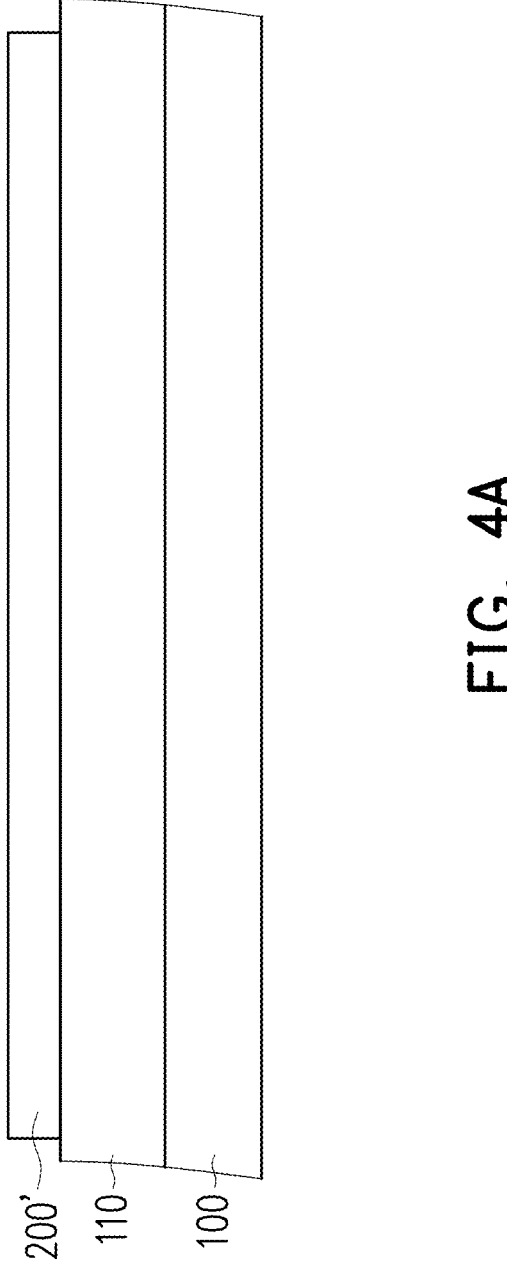
FIGS. 4A to 4I are schematic cross-sectional views of a manufacturing method of a thin film transistor according to an embodiment of the present invention.

FIGS. 4A to 4I are schematic cross-sectional views of a manufacturing method of a thin film transistor 10A according to an embodiment of the present invention. Referring to FIG. 4A, a first insulation layer 110 is formed on the substrate 100. A semiconductor material layer 200' is formed on the first insulation layer 110.

Figure 4B:
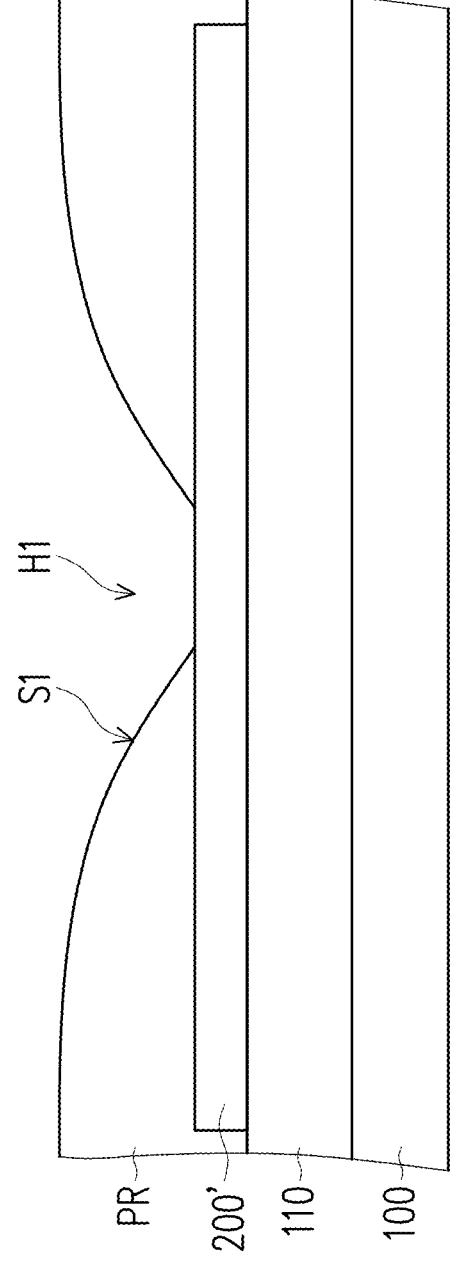
Figure 4B:

Referring to FIG. 4B, a mask layer PR is formed on the semiconductor material layer 200' and the first insulation layer 110. The mask layer PR is, for example, cured photoresist, and the mask layer PR includes a first opening H1. In this embodiment, the sidewall S1 of the first opening H1 is a curved surface or an inclined surface, resulting in a reduction in the thickness of the mask layer PR as it approaches the first opening H1.

Figure 4C:
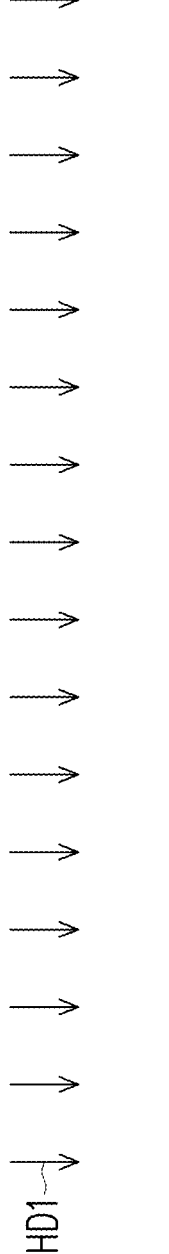
Figure 4C:
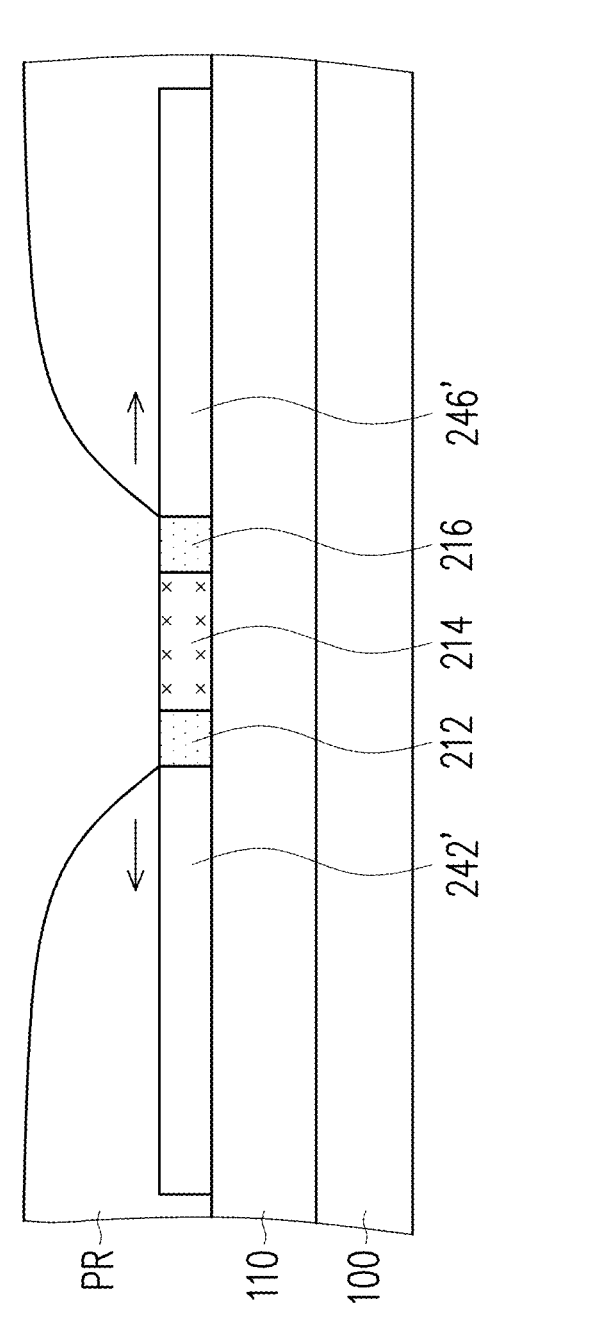

Referring to FIG. 4C, a doping process HD1 is performed on the semiconductor material layer 200' using the mask layer PR as a mask to form a first lightly doped region 212, a second lightly doped region 216, a bridging region 214, a first intrinsic semiconductor region 242' and a second intrinsic semiconductor region 246 within the semiconductor material layer 200'. The first lightly doped region 212, the second lightly doped region 216, and the bridging region 214 are located between the first intrinsic semiconductor region 242' and the second intrinsic semiconductor region 246'.

In this embodiment, the sidewall S1 of the first opening H1 is relatively gentle, and the thickness of the mask layer PR decreases as it approaches the first opening H1. During the doping process HD1 applied to the semiconductor material layer 200' at the bottom of the first opening H1, the thinner section of the mask layer PR is easily removed, causing outward expansion of the first opening H1. The position where the first lightly doped region 212 and the second lightly doped region 216 are scheduled to form in the semiconductor material layer 200' at least partially overlaps with the sidewall S1 of the first opening H1 before outward expansion occurs.

Since the first lightly doped region 212 and the second lightly doped region 216 are only doped after the outward expansion of the first opening H1, the duration of doping for the first lightly doped region 212 and the second lightly doped region 216 in the doping process HD1 is shorter than the duration of doping for the bridging region 214 in the doping process HD1. As a result, the doping concentration of the bridging region 214 is higher than the doping concentrations of the first lightly doped region 212 and the second lightly doped region 216.

In some embodiments, the dopant used in the doping process HD1 is a P-type dopant (such as boron, aluminum, gallium or other suitable elements), and the first lightly doped region 212, the second lightly doped region 216 and the bridging region 214 include P-type semiconductor layer, and the doping dosage of the doping process HD1 is greater than 1E15 atom/cm$^2$.

In some embodiments, the dopant used in the doping process HD1 is an N-type dopant (such as phosphorus, arsenic, tellurium or other suitable elements), and the first lightly doped region 212, the second lightly doped region 216 and the bridging region 214 include N-type semiconductor layer, and the doping dosage of the doping process HD1 is greater than 1E14 atom/cm$^2$.

In this embodiment, by adjusting the type of the mask layer PR, the thickness of the mask layer PR, the slope of the sidewall S1, the energy of the doping process HD1, and/or the doping dosage of the doping process HD1, the outward expansion of the first opening H1 during the doping process HD1 can be achieved. Consequently, the mask layer PR can be utilized to form the first lightly doped region 212, the second lightly doped region 216, and the bridging region 214 having different doping concentrations.

In some embodiments, the dopant used in the doping process HD1 is a P-type dopant (such as boron, aluminum, gallium or other suitable elements), and the first lightly doped region 212 and the second lightly doped region 216 include a P-type semiconductor layer, and the doping dosage is 4E14 atom/cm$^2$ to 5E12 atom/cm$^2$.

In some embodiments, the dopant used in the doping process HD1 is an N-type dopant (such as phosphorus, arsenic, tellurium or other suitable elements), and the first lightly doped region 212 and the second lightly doped region 216 include an N-type semiconductor layer, and the doping dosage is 4E13 atom/cm$^2$ to 6E12 atom/cm$^2$.

The first lightly doped region 212 and the second lightly doped region 216 serve to suppress the generation of horizontal electric fields, thereby improving the impact of the kink effect on the drain current. Additionally, they contribute to the amelioration of current leakage issues.

Figure 4D:
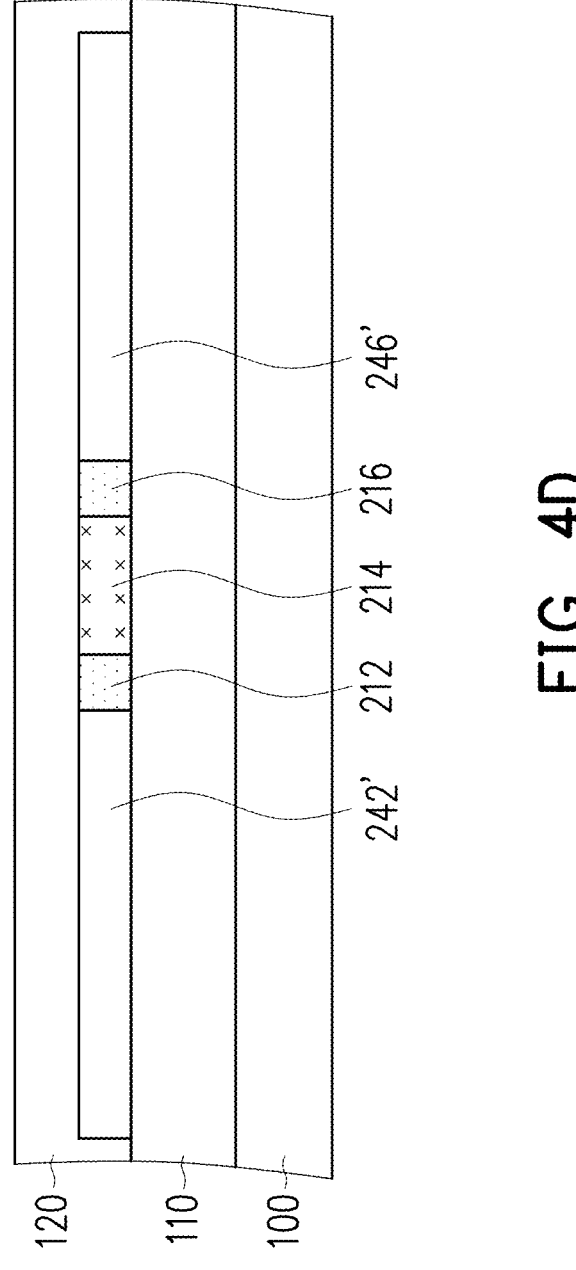

Referring to FIG. 4D, the mask layer PR is removed. The second insulation layer 120 is formed on the first lightly doped region 212, the second lightly doped region 216, the bridging region 214, the first intrinsic semiconductor region 242' and the second intrinsic semiconductor region 246'.

Figure 4E:
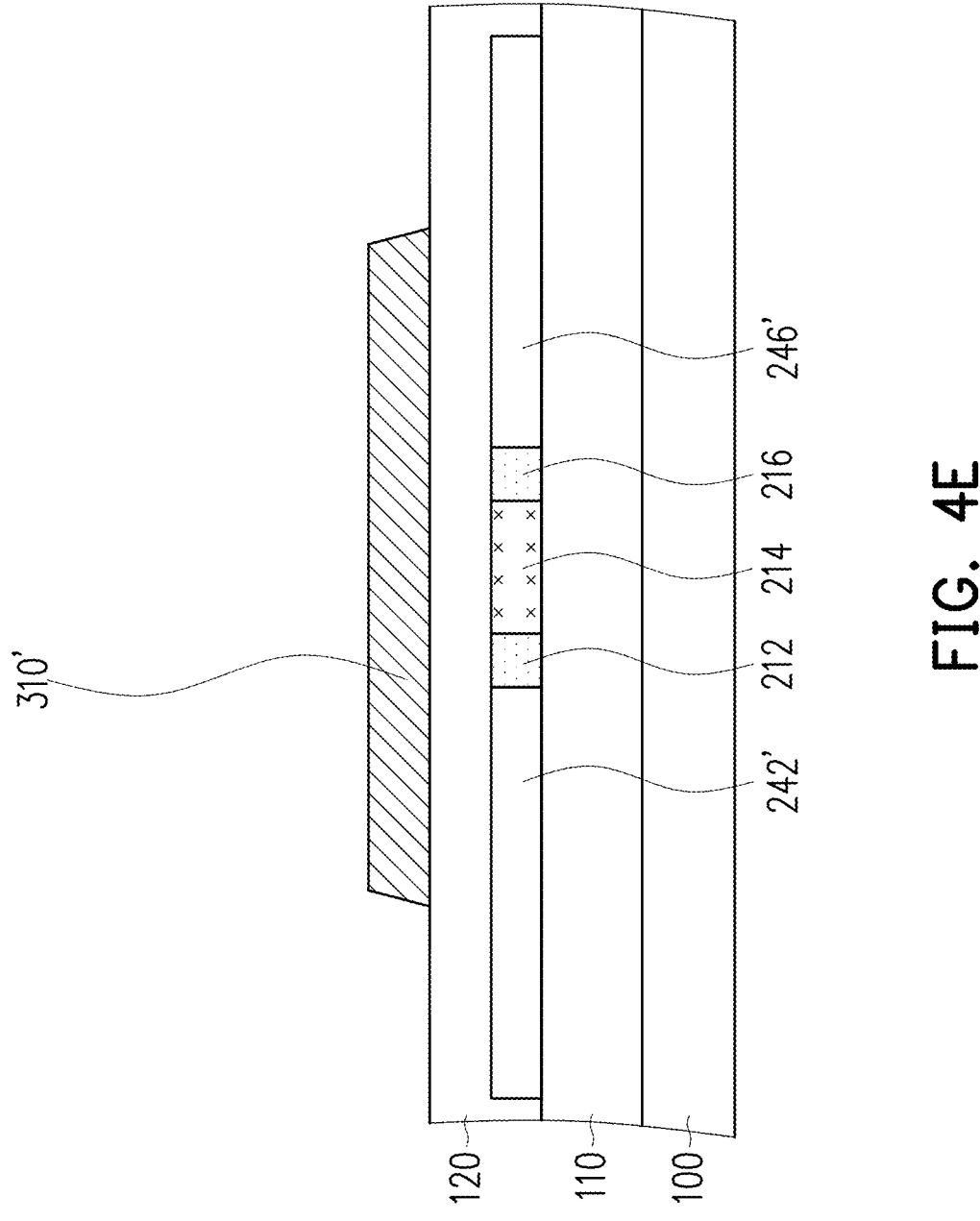

Referring to FIG. 4E, a gate electrode material layer 310' is formed on the second insulation layer 120. The gate electrode material layer 310' overlaps the first lightly doped region 112, the second lightly doped region 116 and the bridging region 114 in the normal direction ND of the top surface of the substrate 100, and the gate electrode material layer 310' is partially overlaps the first intrinsic semiconductor region 242' and the second intrinsic semiconductor region 246' in the normal direction ND of the top surface of the substrate 100.

Figure 4F:
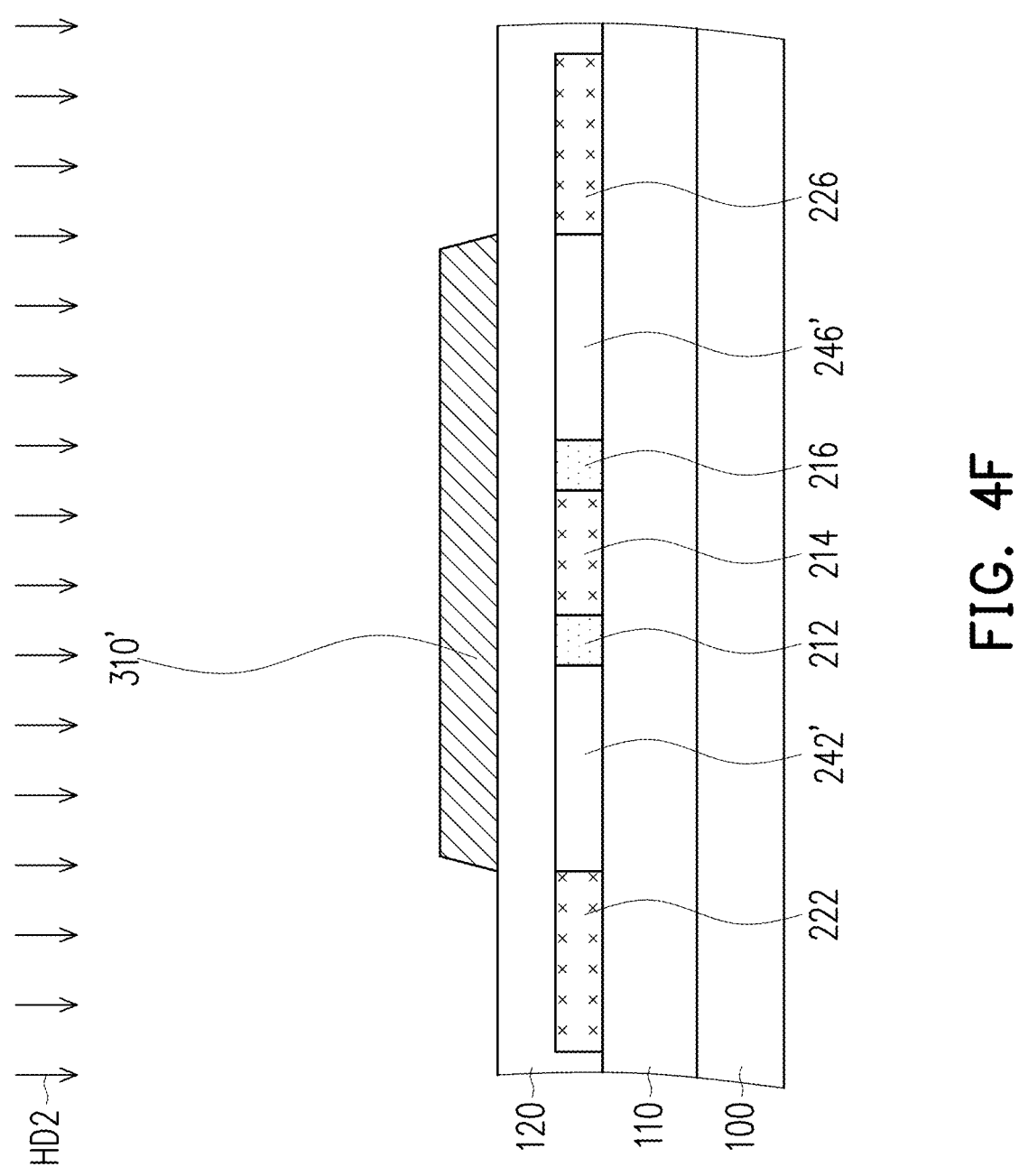

Referring to FIG. 4F, using the gate electrode material layer 310' as a mask, another doping process HD2 is applied to the first intrinsic semiconductor region 242' and the second intrinsic semiconductor region 246' to form a first heavily doped region 222 and a second heavily doped region 226, respectively. Since the portion of the first intrinsic semiconductor region 242' overlapped with the gate electrode material layer 310' and the portion of the second intrinsic semiconductor region 246' overlapped with the gate electrode material layer 310' are covered by the gate electrode material layer 310', the portion of the first intrinsic semiconductor region 242' and the portion of the second intrinsic semiconductor region 246' are not subjected to be dopped during the doping process HD2.

In some embodiments, the dopant used in the doping process HD2 is a P-type dopant (such as boron, aluminum, gallium or other suitable elements), and the first heavily doped region 222 and the second heavily doped region 226 include a P-type semiconductor layer, and the doping dosage of the doping process HD2 is greater than 1E15 atoms/cm$^2$.

In some embodiments, the dopant used in the doping process HD2 is an N-type dopant (such as phosphorus, arsenic, tellurium or other suitable elements), and the first heavily doped region 222 and the second heavily doped region 226 include an N-type semiconductor layer, and the doping dosage of doping process HD2 is greater than 1E14 atoms/cm$^2$.

In some embodiments, the doping dosage of the doping process HD2 is the same as or different from the doping dosage of doping process HD1 (referring to FIG. 4C).

Figure 4G:

Referring to FIG. 4G, the gate electrode material layer 310' is etched to form the gate electrode 310. Using the gate electrode 310 as a mask, another doping process LD2 is performed on the portions of the first intrinsic semiconductor region 242' and the second intrinsic semiconductor region 246' that have not been doped in the doping process HD2 to respectively form a third lightly doped region 232 and a fourth lightly doped region 236 in the first intrinsic semiconductor region 242' and the second intrinsic semiconductor region 246'. The first intrinsic semiconductor region 242' between the first lightly doped region 212 and the third lightly doped region 232 is the first channel region 242, and the second intrinsic semiconductor region 246' between the second lightly doped region 216 and the fourth lightly doped region 236 is the second channel region 246.

In some embodiments, the doping dosage of the doping process LD2 is less than the doping dosage of the doping process HD1 (referring to FIG. 4C) and the doping dosage of the doping process HD2 (referring to FIG. 4F).

In some embodiments, the dopant used in the doping process LD2 is a P-type dopant (such as boron, aluminum, gallium or other suitable elements), and the third lightly doped region 232 and the fourth lightly doped region 236 include a P-type semiconductor layer, and the doping dosage of the doping process LD2 is 4E14 atom/cm$^2$ to 5E12 atom/cm$^2$.

In some embodiments, the dopant used in the doping process LD2 is an N-type dopant (such as phosphorus, arsenic, tellurium or other suitable elements), and the third lightly doped region 232 and the fourth lightly doped region 236 include an N-type semiconductor layer, and the doping dosage of the doping process LD2 is 4E13 atom/cm$^2$ to 6E12 atom/cm$^2$.

In some embodiments, when the first channel region 242 and the second channel region 244 are P-type semiconductors, the doping dosage of the first channel region 242 and the second channel region 244 is less than 5E12 atoms/cm$^2$; when the first channel region 242 and the second channel region 244 are N-type semiconductors, the doping dosage of the first channel region 242 and the second channel region 244 is less than 6E12 atoms/cm$^2$.

Figure 4H:
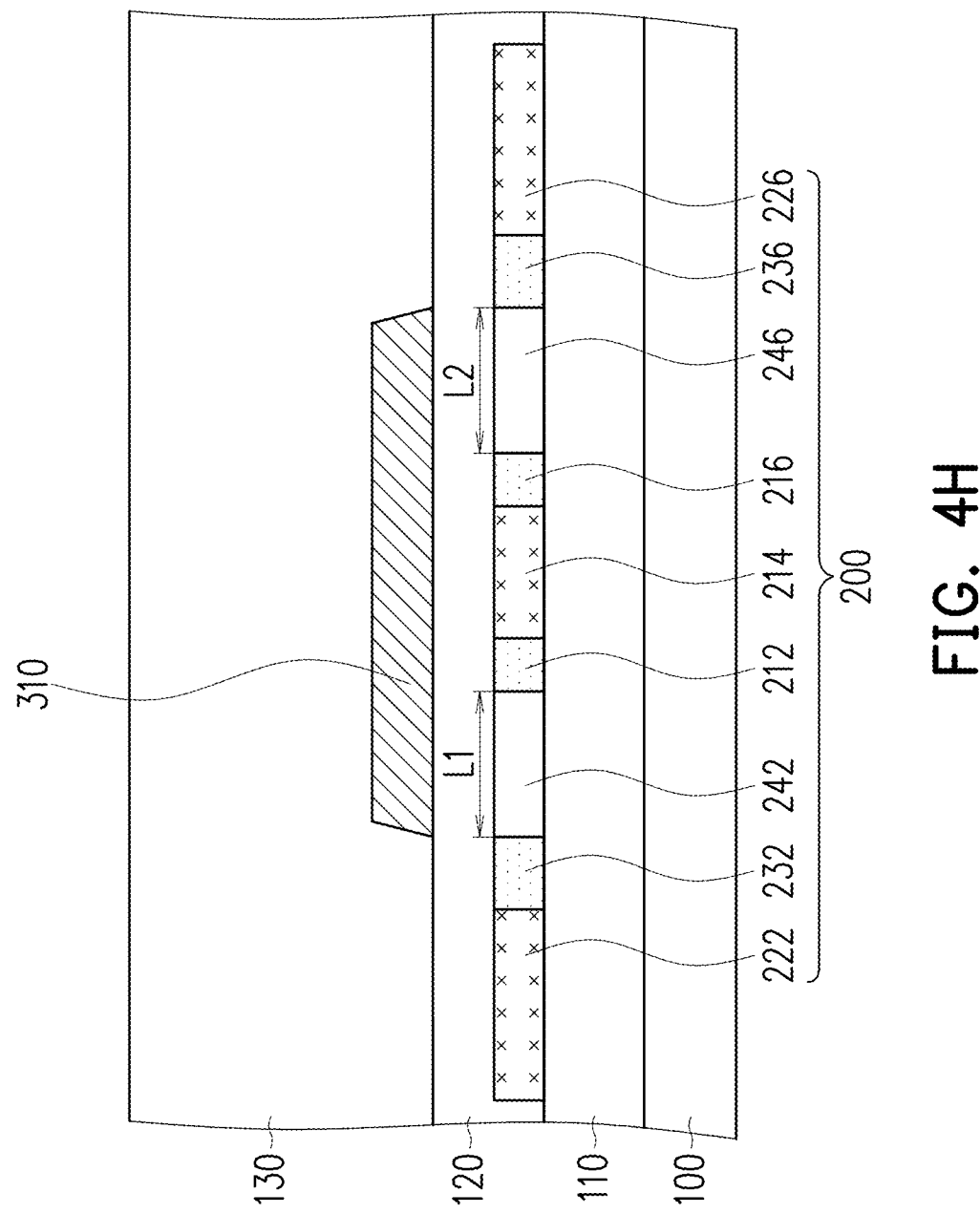

Referring to FIG. 4H, a third insulation layer 130 is formed on the second insulation layer 120 and the gate electrode 310.

Figure 4I:

Referring to FIG. 4I, an etching process is performed to form a first through hole TH1 and a second through hole TH2 passing through the second insulation layer 120 and the third insulation layer 130. The first through hole TH1 and the second through hole TH2 respectively expose the first heavily doped region 222 and the second heavily doped region 226.

Finally, returning to FIG. 1B, the source electrode 322 and the drain electrode 324 are formed on the third insulation layer 130. The source electrode 322 and the drain electrode 324 are respectively filled into the first through hole TH1 and the second through hole TH2, respectively establishing electrical connections to the first heavily doped region 222 and the second heavily doped region 226. At this point, the thin film transistor 10A is roughly completed.

Figure 5A:
FIGS. 5A to 5J are schematic cross-sectional views of a manufacturing method of a thin film transistor according to an embodiment of the present invention.
Figure 5B:
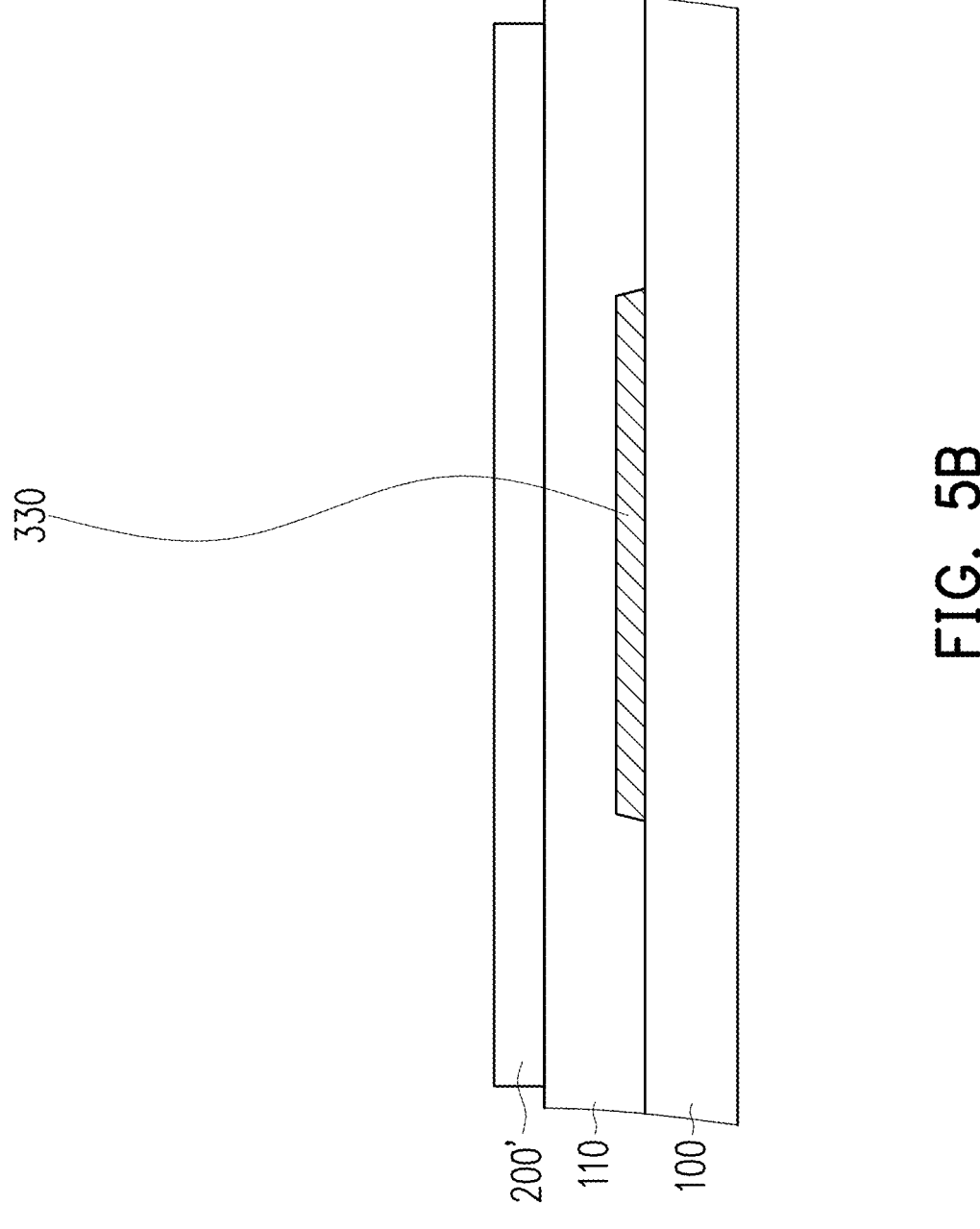
Figure 5C:
Figure 5D:
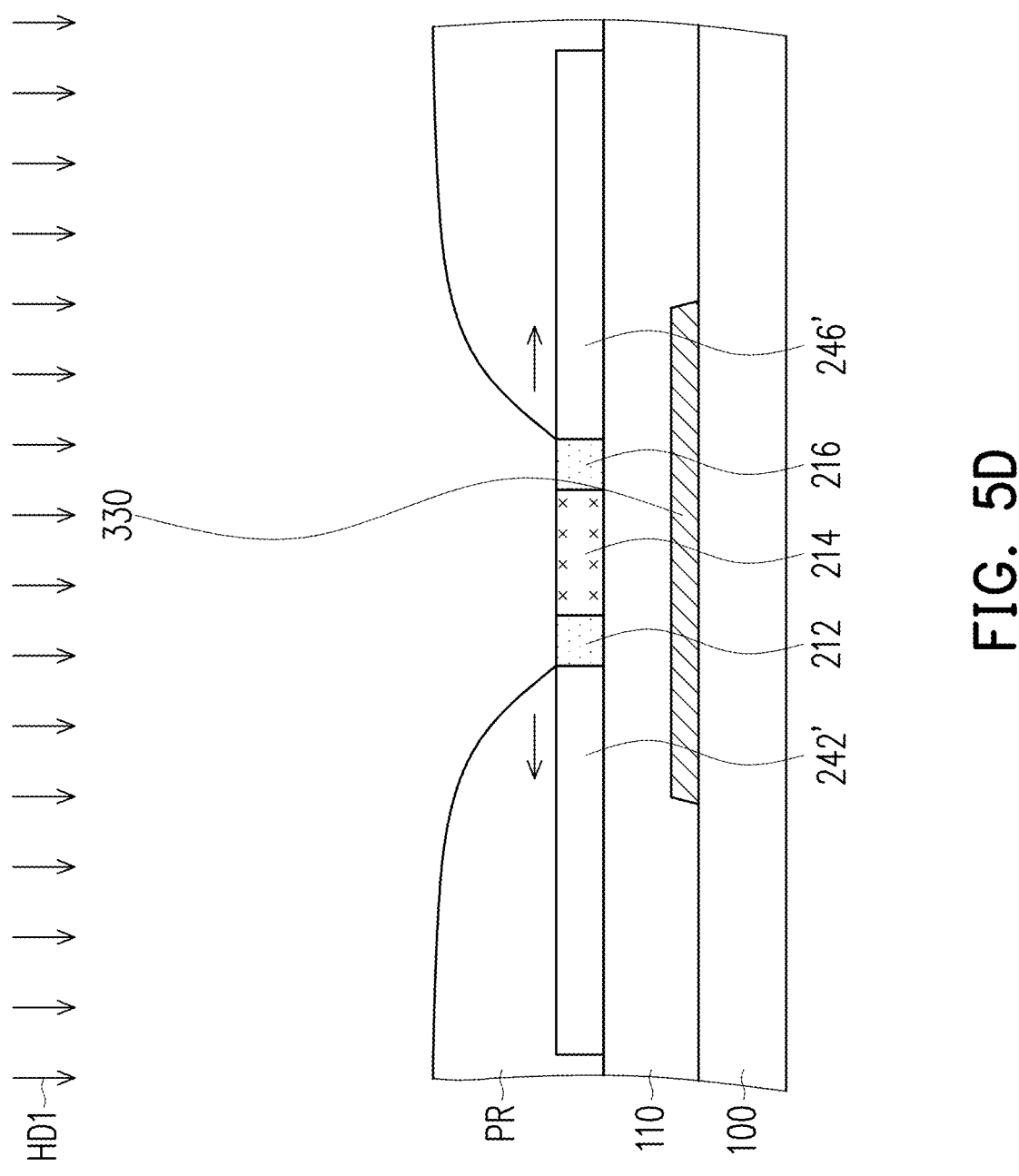
Figure 5E:
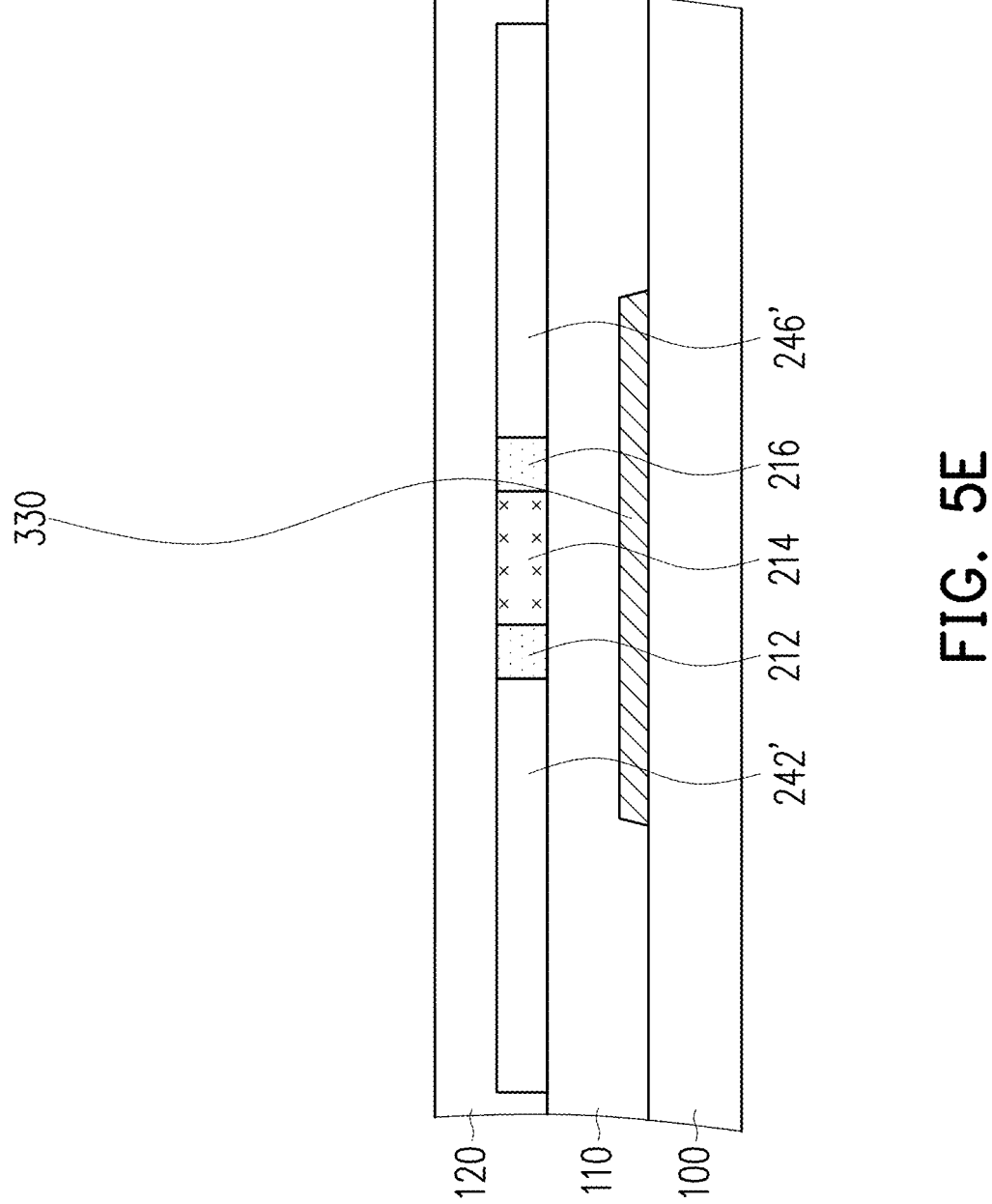
Figure 5F:
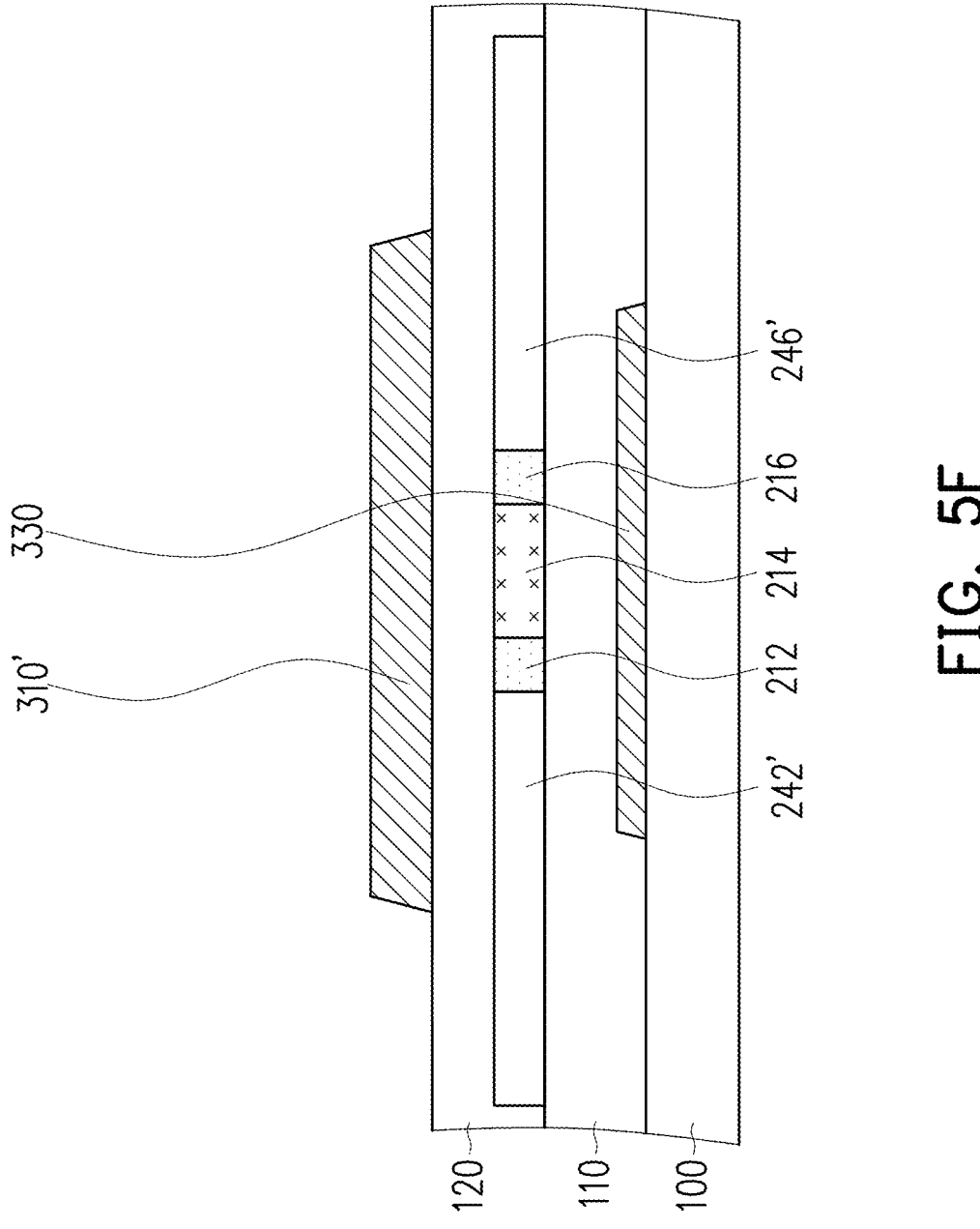
Figure 5G:
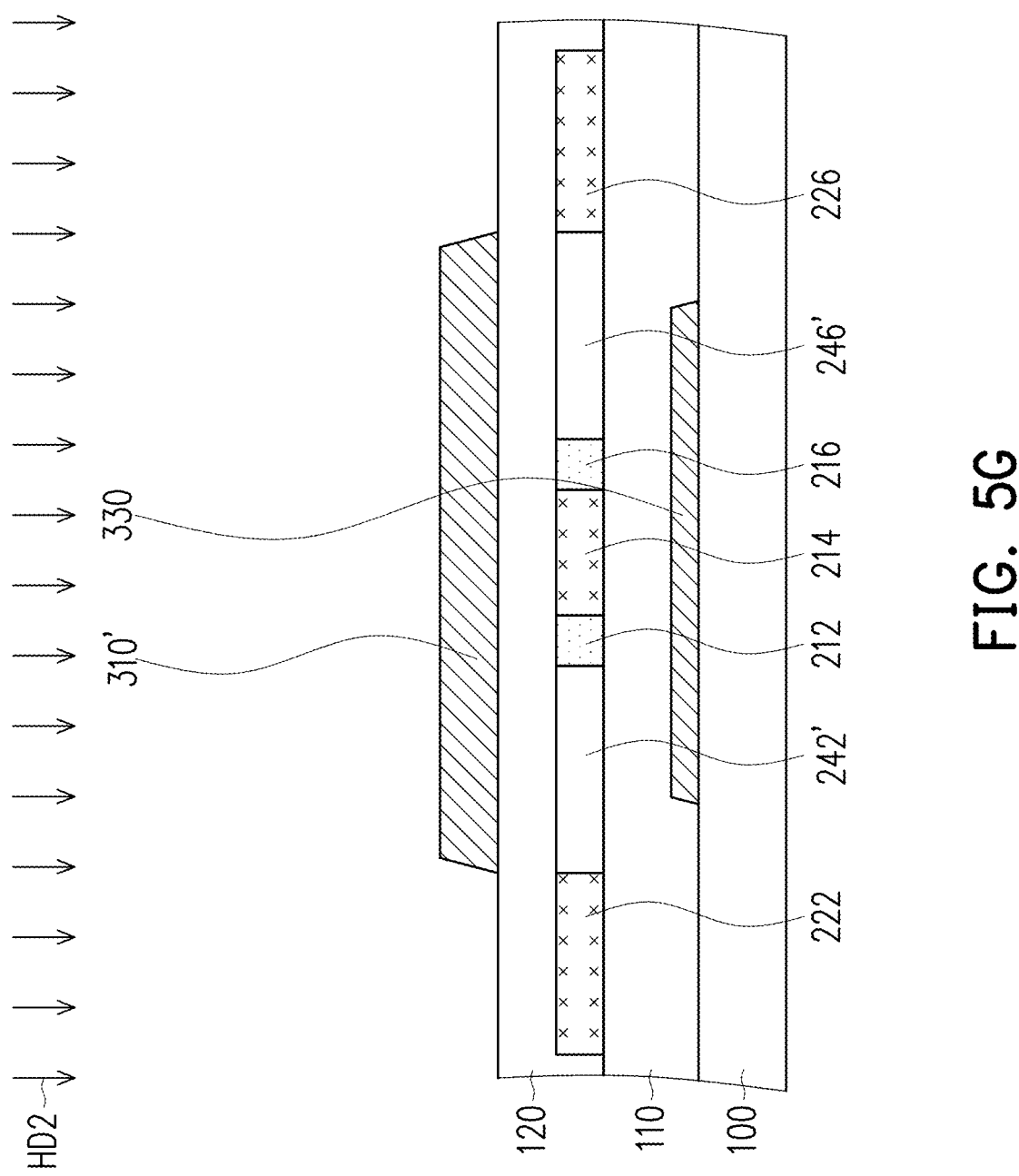
Figure 5H:
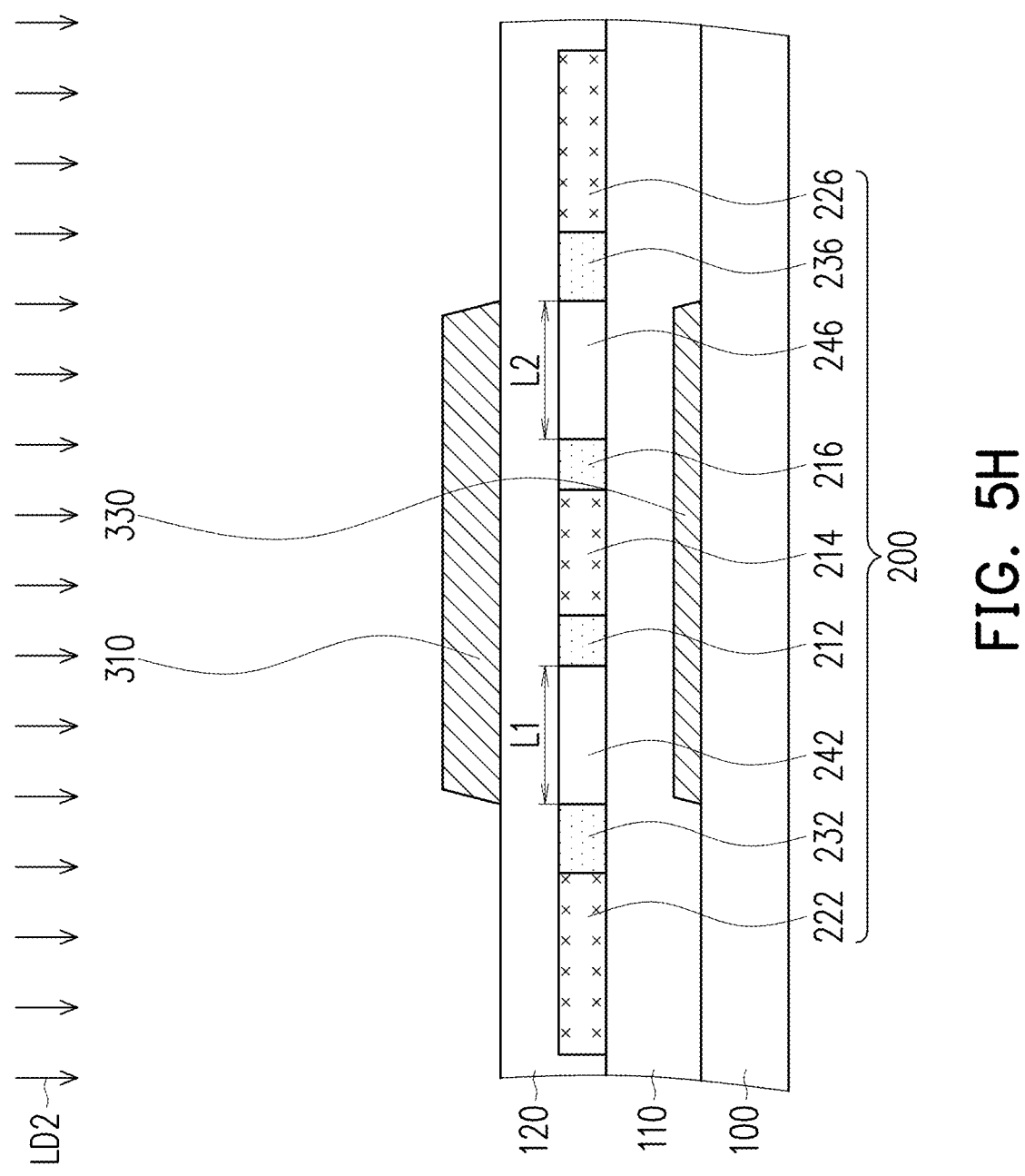
Figure 5I:
Figure 5J:

FIGS. 5A to 5J are schematic cross-sectional views of a manufacturing method of a thin film transistor 10B (referring to FIG. 2B) according to an embodiment of the present invention. In this embodiment, a gate electrode 330 is formed on the substrate 100, as shown in FIG. 5A. Next, the steps of FIG. 5B to FIG. 5J are performed. The steps in FIGS. 5B to 5J are similar to the steps in FIGS. 4A to 4I, where the same or similar reference numerals are used to represent the same or similar elements, and description of the same technical content being omitted. For a description of an omitted part, reference may be made to the foregoing embodiment, and the descriptions thereof are omitted herein.

Figure 6A:
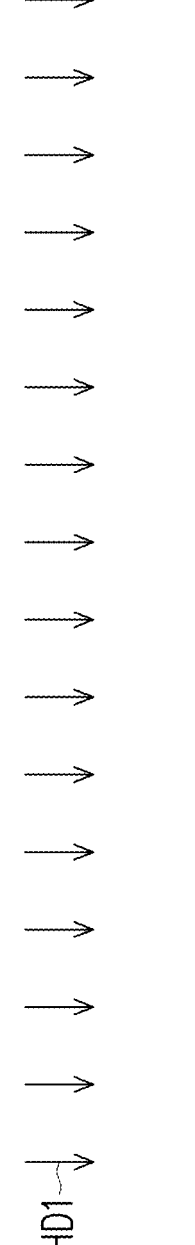
FIGS. 6A to 6C are schematic cross-sectional views of a manufacturing method of a thin film transistor according to an embodiment of the present invention.
Figure 6A:
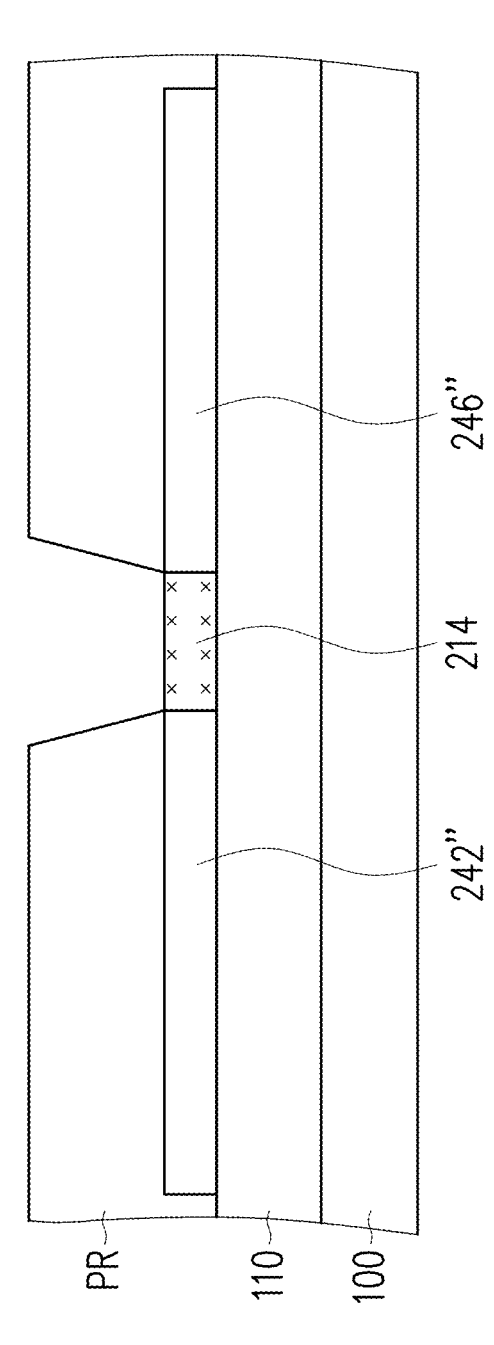
Figure 6B:
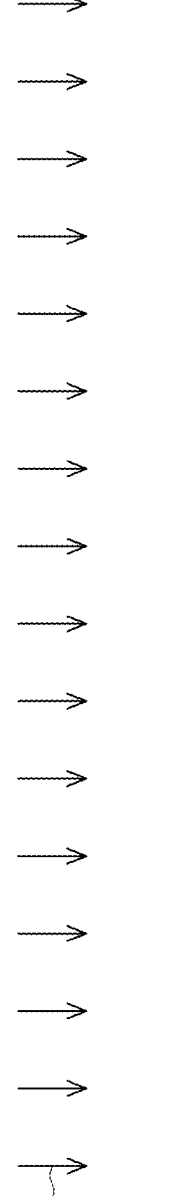
Figure 6B:
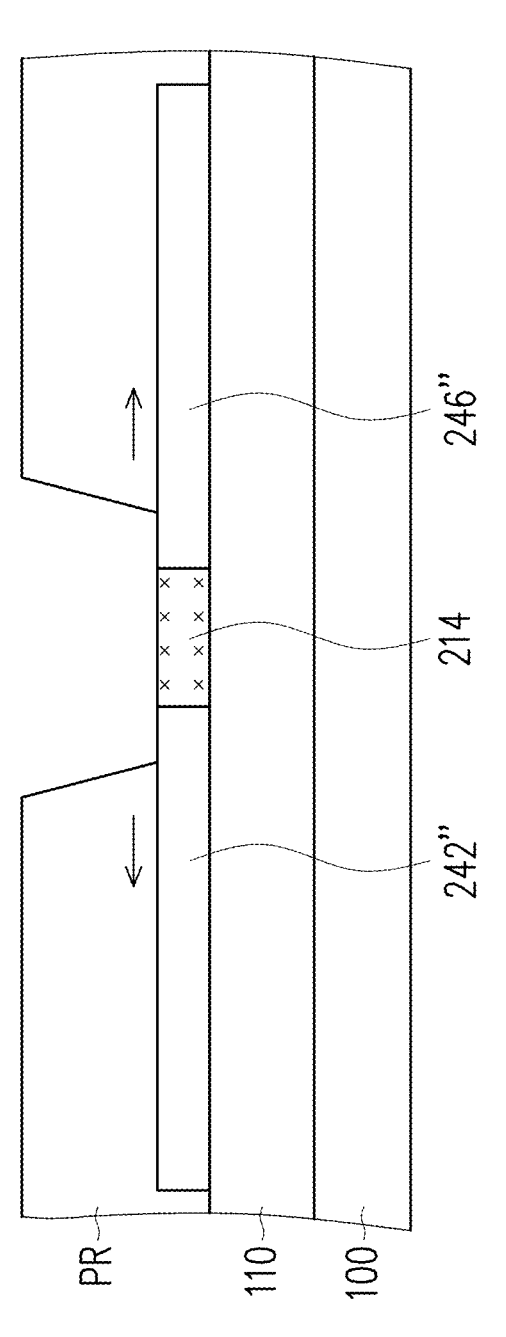
Figure 6C:
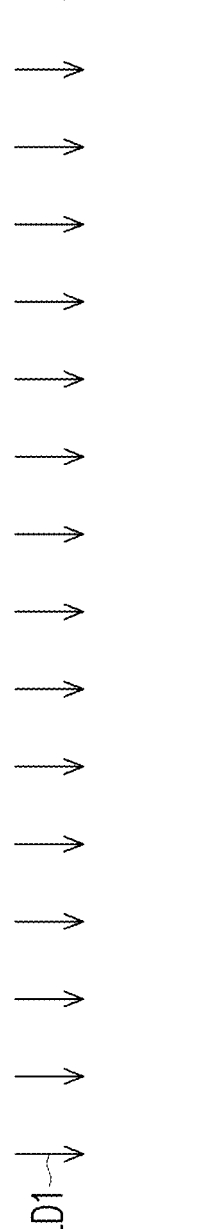
Figure 6C:
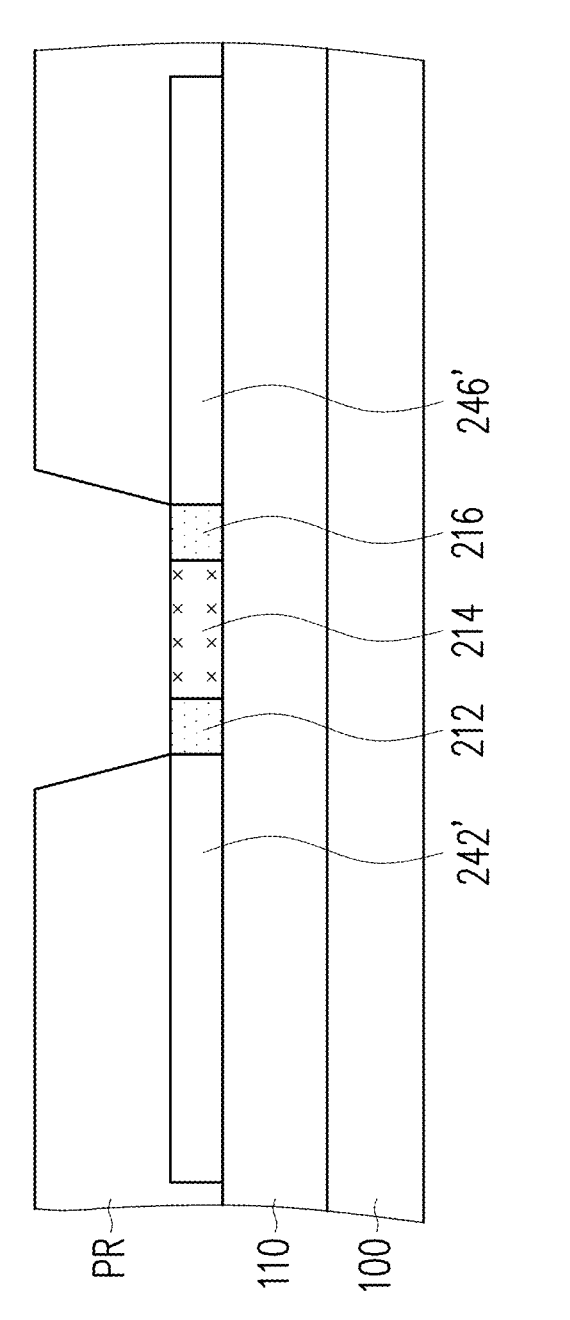

FIGS. 6A to 6C are schematic cross-sectional views of a manufacturing method of a thin film transistor according to an embodiment of the present invention. Continuing from the step in FIG. 4A, FIG. 6A involves the formation of a mask layer PR on the semiconductor material layer 200' and the first insulation layer 110. The mask layer PR, for example, is a cured photoresist and includes a first opening H1. In this embodiment, the first opening H1 features steep sidewalls S1.

Using the mask layer PR as a mask, a first doping process HD1 is performed on the semiconductor material layer 200' to form the bridging region 214. In this embodiment, since the portion of the mask layer PR near the first opening H1 is thick, the first opening H1 is less prone to outward expansion during the initial doping process HD1. Consequently, the first portion 242" and the second portion 246" in the semiconductor material layer 200', which were not doped during the first doping process HD1, are positioned on either side of the bridging region 214.

In some embodiments, the dopant used in the doping process HD1 is a P-type dopant (such as boron, aluminum, gallium or other suitable elements), the bridging region 214 includes a P-type semiconductor layer, and the doping dosage of the doping process HD1 is greater than 1E15 atoms/cm$^2$.

In some embodiments, the dopant used in the doping process HD1 is an N-type dopant (such as phosphorus, arsenic, tellurium or other suitable elements), the bridging region 214 includes an N-type semiconductor layer, and the doping dosage of doping process HD1 is greater than 1E14 atoms/cm$^2$.

Referring to FIG. 6B, after the first doping process HD1, the mask layer PR is subjected to an ashing process AS so that the first opening H1 expands outward and exposes the first portion 242" and the second portion 246".

Referring to FIG. 6C, following the outward expansion of the first opening H1, a second doping process LD1 is carried out, using the mask layer PR as a mask. This forms the first lightly doped region 212 and the first intrinsic semiconductor region 242' in the first portion 242', which remained undoped during the initial doping process HD1. Additionally, it results in the formation of the second lightly doped region 216 and the second intrinsic semiconductor region 246' in the second portion 246'.

In some embodiments, the dopant used in the doping process LD1 is a P-type dopant (such as boron, aluminum, gallium or other suitable elements), and the first lightly doped region 212 and the second lightly doped region 216 include a P-type semiconductor layer, and the doping dosage of the doping process LD1 is 4E14 atom/cm$^2$ to 5E12 atom/cm$^2$.

In some embodiments, the dopant used in the doping process LD1 is an N-type dopant (such as phosphorus, arsenic, tellurium or other suitable elements), and the first lightly doped region 212 and the second lightly doped region 216 include an N-type semiconductor layer, and the doping dosage of the doping process LD1 is 4E13 atom/cm$^2$ to 6E12 atom/cm$^2$.

Subsequently, execute the steps from FIGS. 4D to 4I to form the thin-film transistor 10A.

Figure 7A:
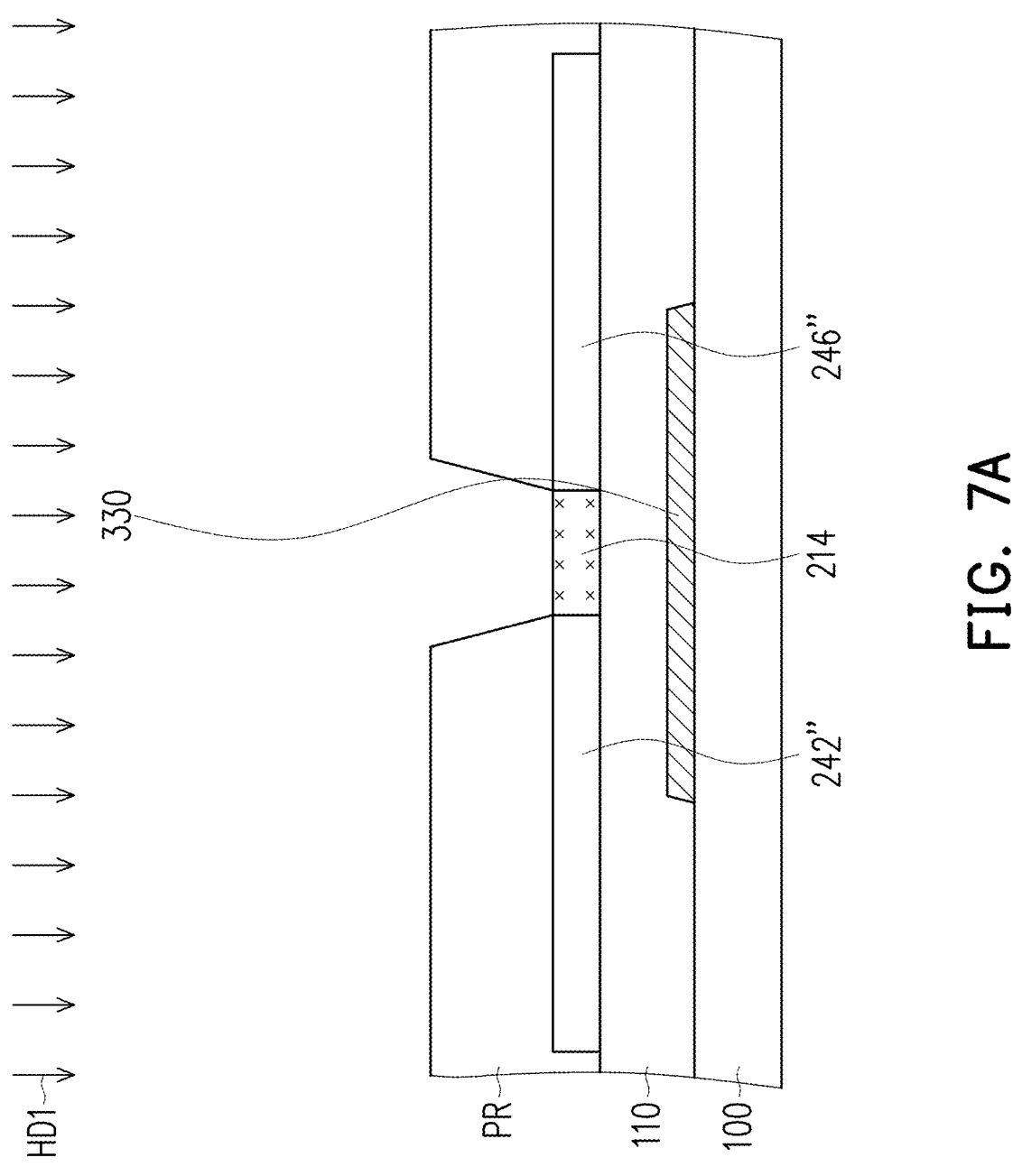
FIGS. 7A to 7C are schematic cross-sectional views of a manufacturing method of a thin film transistor according to an embodiment of the present invention.
Figure 7B:
Figure 7C:

In the embodiments of FIGS. 6A to 6C, there is no gate electrode between the first insulation layer 110 and the substrate 100. However, the present invention is not limited thereto. In other embodiments, as illustrated in FIGS. 7A to 7C, there is a gate electrode 330 between the first insulation layer 110 and the substrate 100.

In summary, the thin-film transistor of the present invention, with a portion of the semiconductor layer overlapping with the gate electrode forming a bridging region, reduces the resistance of the semiconductor layer and enhances the drain current of the thin-film transistor. Additionally, by setting the first lightly doped region, the second lightly doped region, the third lightly doped region, and the fourth lightly doped region, the generation of horizontal electric fields is suppressed, thereby improving the impact of the kink effect on the drain current and addressing current leakage issues.

What is claimed is:

1. A method for manufacturing a thin film transistor, comprising:
  using a mask layer as a mask to perform one or two doping processes on a semiconductor material layer to form a first lightly doped region, a second lightly doped region, a bridging region, a first intrinsic semiconductor region and a second intrinsic semiconductor region within the semiconductor material layer, wherein a doping concentration of the bridging region is greater than doping concentrations of the first lightly doped region and the second lightly doped region;

forming an insulation layer on the first lightly doped region, the second lightly doped region, the bridging region, the first intrinsic semiconductor region and the second intrinsic semiconductor region;

form a gate electrode material layer on the insulation layer, wherein the gate electrode material layer overlaps the first lightly doped region, the second lightly doped region and the bridging region, and the gate electrode material layer partially overlaps the first intrinsic semiconductor region and the second intrinsic semiconductor region;

using the gate electrode material layer as a mask to perform another doping process on the first intrinsic semiconductor region and the second intrinsic semiconductor region to respectively form a first heavily doped region and a second heavily doped region within the first intrinsic semiconductor region and the second intrinsic semiconductor region;

etching the gate electrode material layer to form a gate electrode;

using the gate electrode as a mask to perform a still another doping process on portions of the first intrinsic semiconductor region and the second intrinsic semiconductor region that have not been doped during the another doping process to respectively form a third lightly doped region and a fourth lightly doped region within the first intrinsic semiconductor region and the second intrinsic semiconductor region, wherein the first intrinsic semiconductor region between the first lightly doped region and the third lightly doped region is a first channel region, and the second intrinsic semiconductor region between the second lightly doped region and the fourth lightly doped region is a second channel region, wherein the first lightly doped region connects the bridging region and the first channel region, and the second lightly doped region connects the bridging region and the second channel region, and doping concentrations of the first lightly doped region and the second lightly doped region are greater than doping concentrations of the first channel region and the second channel region; and forming a source electrode and a drain electrode, wherein the source electrode and the drain electrode are electrically connected to the first heavily doped region and the second heavily doped region, respectively.

2. The method of claim 1, wherein the mask layer is a cured photoresist, and the mask layer comprises a first opening, wherein a thickness of the mask layer decreases as it approaches the first opening, wherein one doping process is performed on the semiconductor material layer using the mask layer as the mask, and while the one doping process is performed on the semiconductor material layer at bottom of the first opening, the first opening is expanded outward.

3. The method of claim 2, wherein positions designated for forming the first lightly doped region and the second lightly doped region within the semiconductor material layer at least partially overlap with sidewalls of the first opening before the first opening is expanding outward.

4. The method of claim 2, wherein the first lightly doped region and the second lightly doped region are doped for a shorter time in the one doping process than the bridging region in the one doping process.

5. The method of claim 1, wherein the mask layer is a cured photoresist, and the mask layer includes a first opening, wherein using the mask layer as the mask to perform the one or two doping processes on the semiconductor material layer comprises:

using the mask layer as the mask to perform a first doping process on the semiconductor material layer to form the bridging region in the semiconductor material layer;

performing an ashing process on the mask layer to expand the first opening outward after the first doping process; and after the first opening expanding outward, using the mask layer as the mask to perform a second doping process to form the first lightly doped region, the second lightly doped region, the first intrinsic semiconductor region and the second intrinsic semiconductor region in portions of the semiconductor material layer that is not doped during the first doping process.

6. The method of claim 5, wherein the first lightly doped region, the second lightly doped region and the bridging region include P-type semiconductor layers, and a doping dosage of the first doping process is greater than $1E15$ atom/cm$^2$, and a doping dosage of the second doping process is $4E14$ atom/cm$^2$ to $5E12$ atom/cm$^2$.

7. The method of claim 5, wherein the first lightly doped region, the second lightly doped region and the bridging region include N-type semiconductor layers, and a doping dosage of the first doping process is greater than $1E14$ atom/cm$^2$, and a doping dosage of the second doping process is $4E13$ atom/cm$^2$ to $6E12$ atom/cm$^2$.

* * * * *